United States Patent
Wu

(10) Patent No.: US 6,291,841 B1
(45) Date of Patent: Sep. 18, 2001

(54) FLAT INTERCONNECTION SEMICONDUCTOR PACKAGE

(76) Inventor: Jiahn-Chang Wu, 15, Lane 13, Alley 439, Her-Chiang Street, Chu-Tung, Hsinchu (TW)

(*) Notice: Subject to any disclaimer, the term of this patent is extended or adjusted under 35 U.S.C. 154(b) by 0 days.

(21) Appl. No.: 09/480,353

(22) Filed: Jan. 10, 2000

(51) Int. Cl.⁷ ................................................. H01L 33/00
(52) U.S. Cl. ............................ 257/99; 257/91; 257/784
(58) Field of Search ............................ 257/99, 91, 81, 257/82, 84, 784, 431, 433

(56) References Cited

U.S. PATENT DOCUMENTS 4,199,777 * 4/1980 Maruyama et al. .
5,994,722 * 11/1999 Averbeck et al. .
6,180,960 * 1/2001 Kusuda et al. .
6,191,438 * 2/2001 Okehara et al. .

* cited by examiner

Primary Examiner—Sheila V. Clark
(74) Attorney, Agent, or Firm—H. C. Lin, Patent Agent

(57) ABSTRACT

Flat metal strips are used to make connections to a laser diode so that the interconnections are parallel to the surface of the semiconductor device and the structure has a lower profile than a wire-bonded package. The contacts can be made with conducting glue or hard pressed by a lid before sealing with glue.

6 Claims, 7 Drawing Sheets

FLAT INTERCONNECTION SEMICONDUCTOR PACKAGE

BACKGROUND OF THE INVENTION (1) Field of the Invention

This invention relates to semiconductor packaging, in particular to the interconnection in the package.

(2) Description of Related Art

In a conventional semiconductor package, the connection to the semiconductor device is by wire bonding as shown FIG. 1. In this example, several light emitting diodes (LED) 10 are mounted on a substrate 14. At the corner 102 of each LED is a bonding pad as first electrode of the LED. Outside the corner is the light emitting area 106. The second electrode 104 of the LED is in the back of the LED and is not shown. The first electrode 102 of the LED 10 wire bonded for electrical connection. The wire-bonding process is very labor intensive. It is desirable to eliminate such a process in fabrication.

SUMMARY OF THE INVENTION

An object of this invention is to eliminate the wire bonding for connection to a semiconductor device. Another object of this invention is to provide a semiconductor device package which is suitable for mass production.

These objects are achieved by using flat metal strips to make contacts to the semiconductor device and as interconnections for the device. The strips are parallel to the surface of the semiconductor device, resulting in a lower profile.

DETAILED DESCRIPTION OF THE INVENTION

Figure 1:
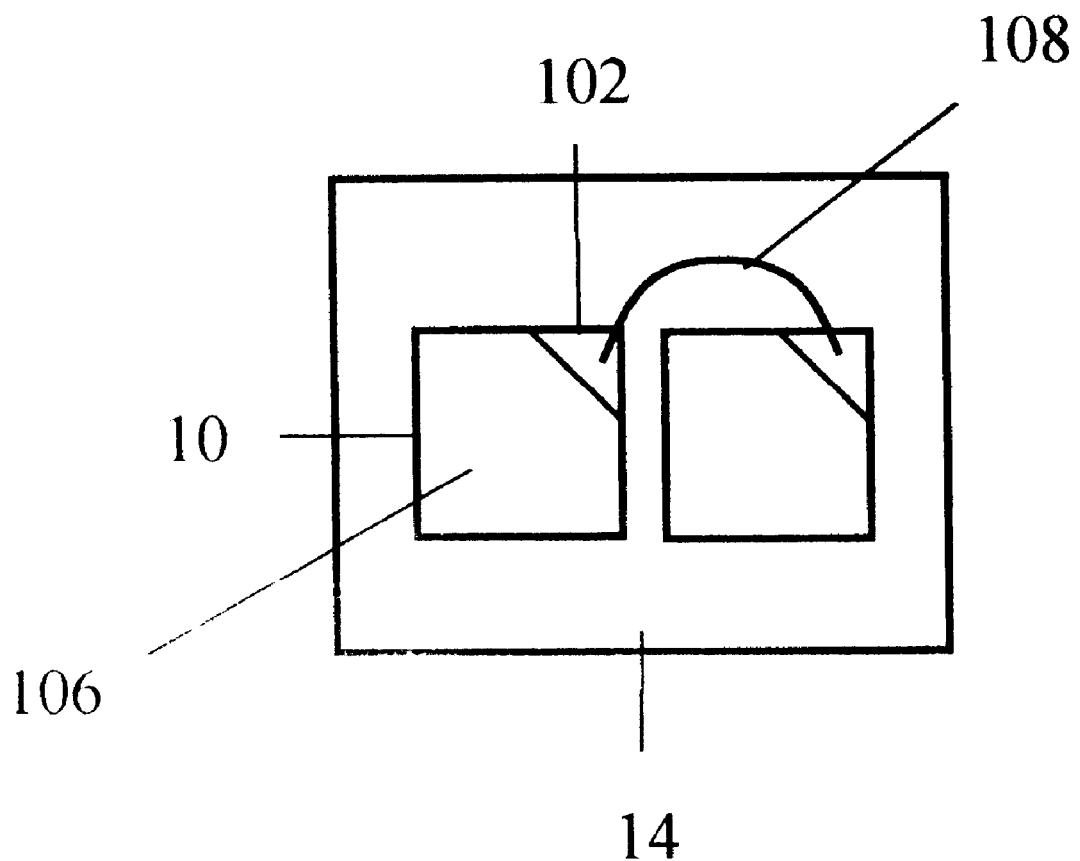
FIG. 1 shows a prior art semiconductor package using wire-bonding connection to the semiconductor device.
Figure 2:
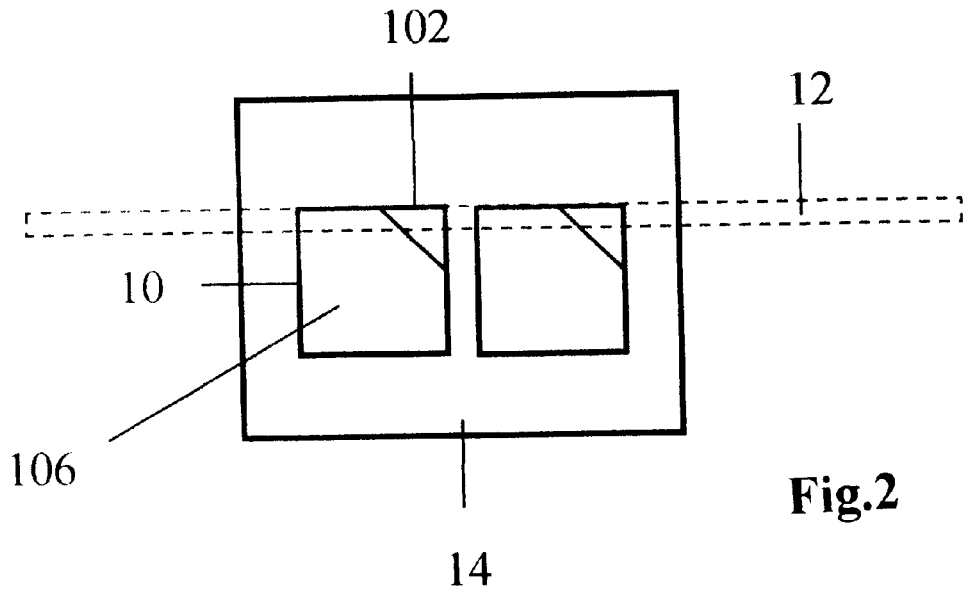
FIG. 2 shows flat metal strip contacting a light emitting diode based on the present invention.

FIG. 2 shows two LED 10 mounted on a substrate 14. The first electrode 102 of the LED is at the right hand top corner of the LED 10. The second electrode of the LED at the back of the device and is not shown. Outside the top surface of the LED is the light emitting area 106. The conductor 12 is placed over the second electrodes 102 of more than one LED. The electrodes 102 is painted with conducting glue (not shown). The conductor 12 is pressed against the electrodes 102 of two devices 10. Thus the package has a flat interconnection without any protruded bonding wires which rise above the flat top surface. The conventional technique of wire-bonding is by thermal compression bonding in which the bonding is made individually. The old process is labor intensive and is not amenable to mass production.

Figure 3:
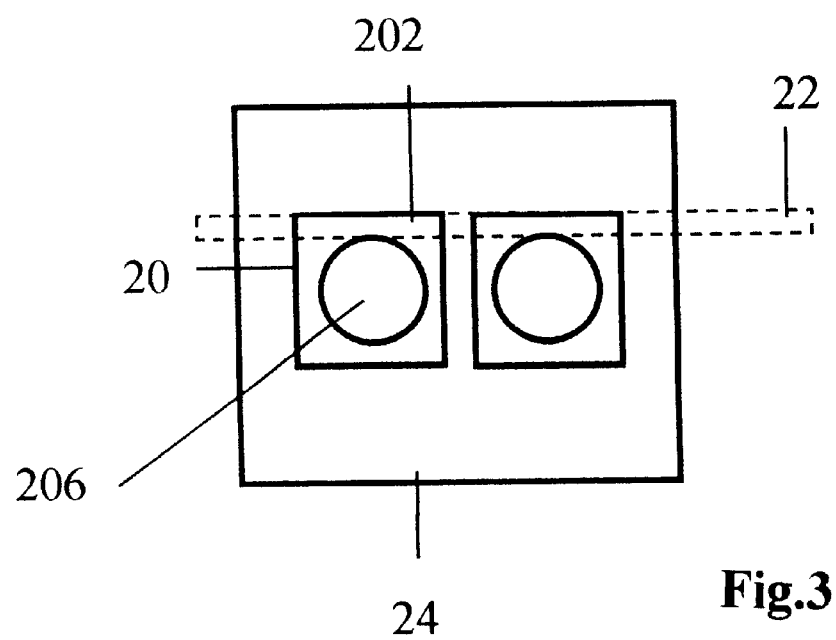
FIG. 3 shows another embodiment of the interconnection in a semiconductor package.

FIG. 3 shows is similar to FIG. 2 including the substrate 24, the light emitting diodes 20, first electrodes 202 and the light emitting area 206. The top electrodes of the LED is first covered with a conducting glue (not shown) and pressed against by an interconnection conductor 22. Then the package is wire-bonded with a flat top.

Figure 4:
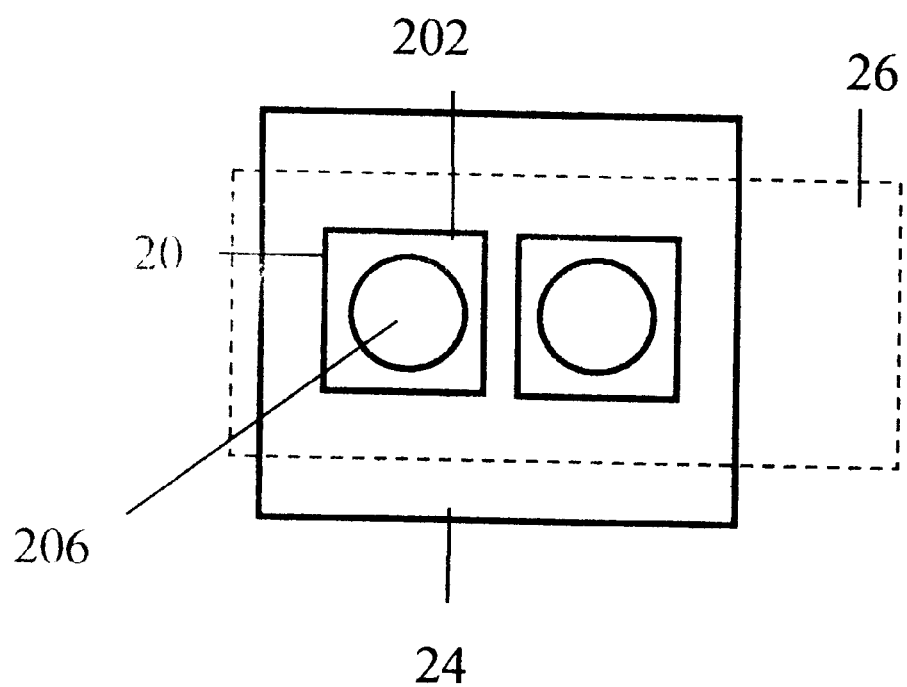
FIG. 4 shows a third embodiment of the interconnection.
Figure 5:
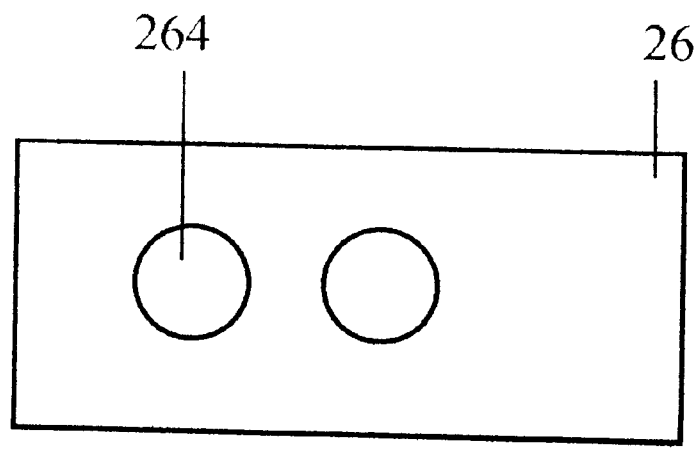
FIG. 5 shows the component parts of FIG. 4.

FIG. 4 shows a third embodiment of the present invention. Each light emitting diode 20 has a light emitting area 206 surrounded by a top electrode 202. The top electrodes 202 of all the LEDs are covered with conductive glue. A thin conductive film 26 having windows 264 (as shown in FIG. 5) against the light emitting areas 206 is pressed against the top electrodes 202. Thus connection is made to the top electrodes and the light emitting from the LED is not blocked.

Figure 6:
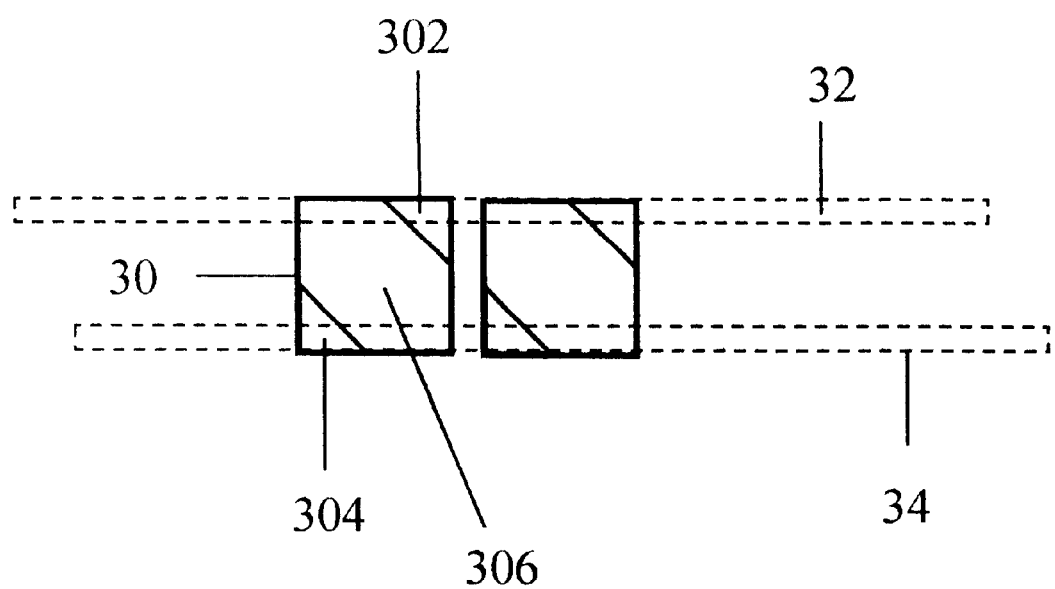
FIG. 6 shows the series interconnection of more than one semiconductor device in a package.

FIG. 6 shows the flat interconnection as applied to LEDs 30 with both electrodes 302 and 304 at two corners on the top surface. The light emitting area 306 lies between the two corners. These electrodes are first covered with conductive glue. Two straight conductors 32 and 34 are glued to the two rows of corner electrodes. 302 and 304. The conductors 32 and 34 provide flat top interconnection.

Figure 7:
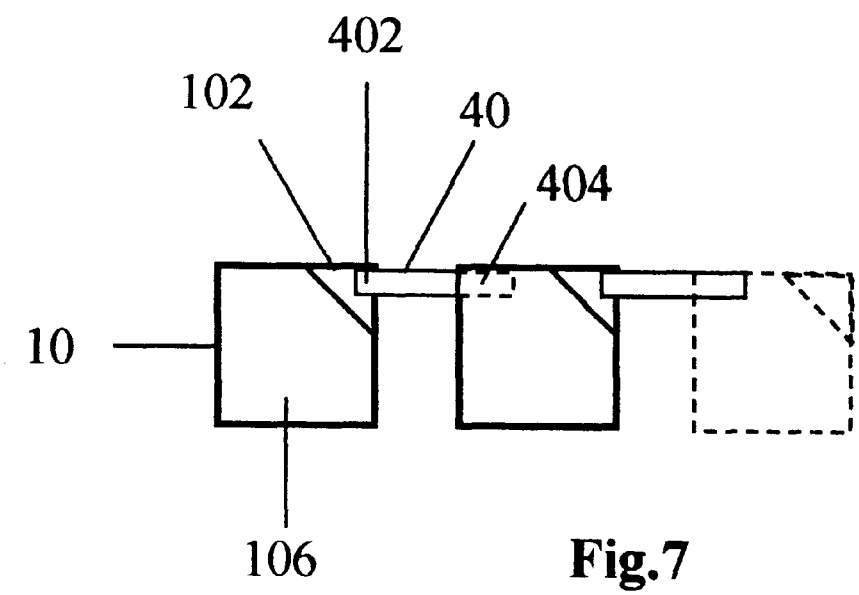
FIG.7 shows a second embodiment of interconnecting more than one semiconductor device in a package.

FIG. 7 shows how a number of LED with top electrodes and bottom electrodes connected in series. Each LED 10 has a light emitting area 106, a top electrode 102 at on corner of the top surface and a bottom electrode (not shown). These LEDs are connected in series by means of the flat conductor 40. These electrodes are first covered with conductive glue, before the flat conductor 40 is glued to these electrodes. The top electrode of the last top electrode and the bottom of the last bottom electrode are not covered with glue and the flat conductor 40 for easy external access.

Figure 8:
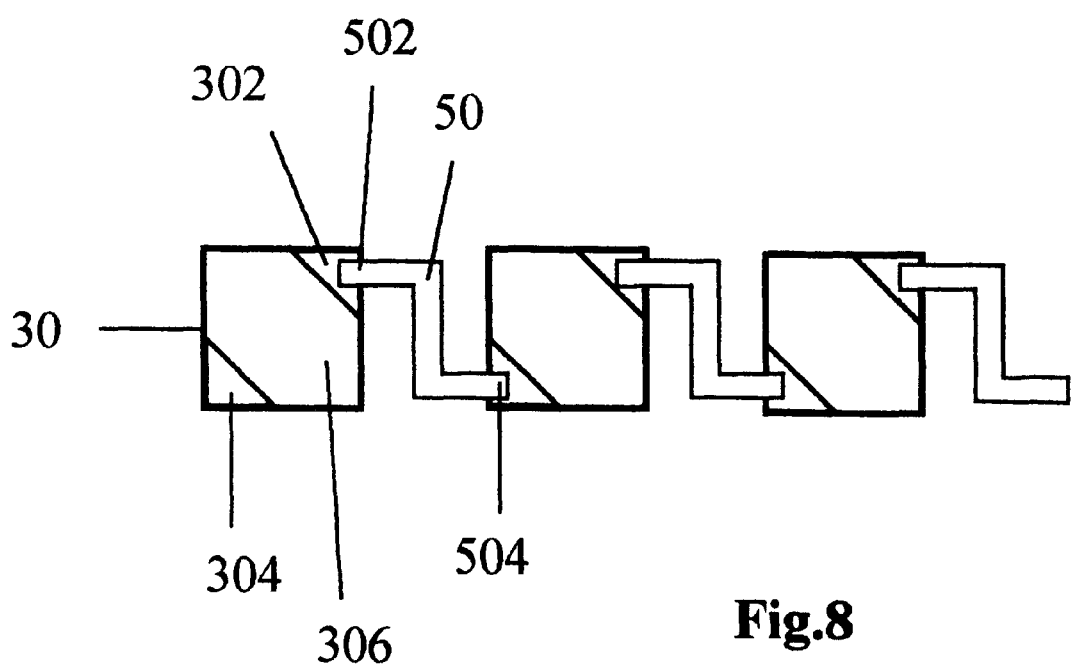
FIG. 8 shows a third embodiment of interconnecting more than one semiconductor device in a package.

FIG. 8 shows another interconnection for series connection of a number of LED 30. The two electrodes of the LED 30 are located at the two opposite corners 302 and 304, outside the light emitting area 306. A Z-shaped link 50 is used to connect the top right electrode 302 at point 502 to the lower left electrode of the next laser diode at point 504. Contacts at point 502 and 504 are made by conductive glue. The electrodes at the beginning and the end of the series laser diodes can be connected directly to external circuits.

Figure 9:
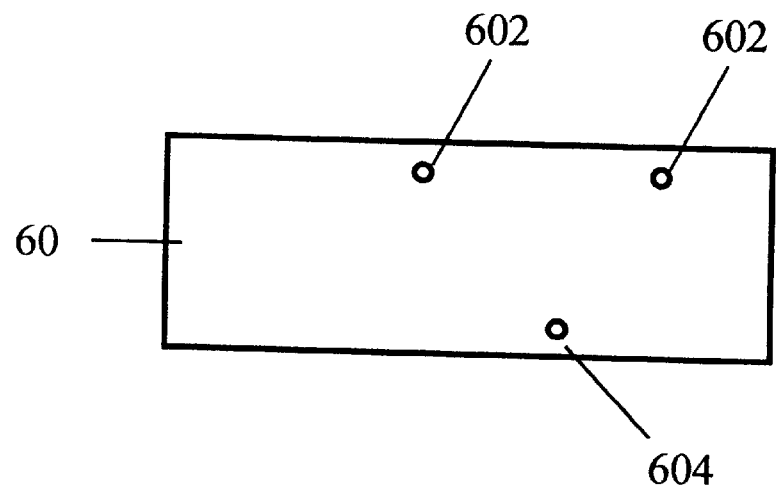
FIG. 9 shows the top lid of FIG. 8.
Figure 9:
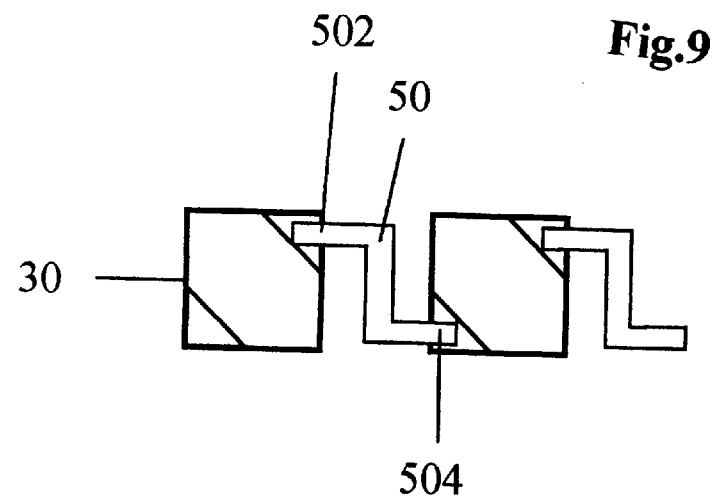
Figure 10:
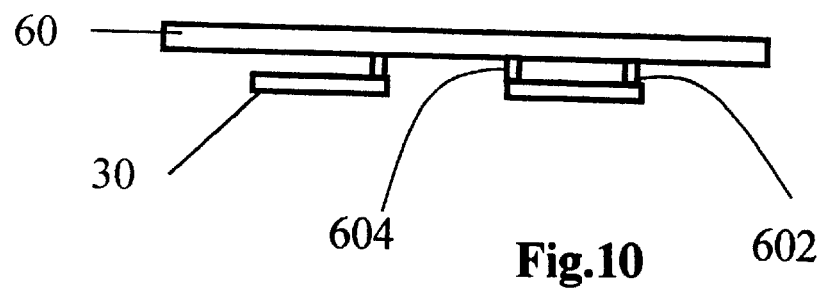
FIG. 10 shows the side view of FIG. 8 after the top lid is pressed on the devices.

Alternatively, the connection between the link 50 and the electrodes at contacts 502 and 504 can be made without applying conductive glue individually as shown in FIGS. 9 and 10. Spacers 602 and 604 are placed opposite the top electrode corners 502. When the lid 60 is pressed against the links 50, contacts are made between the links and the electrodes of the laser diodes 30 as shown in the side view FIG. 10. Afterwards, sealing glue can be injected into entire structure to fix the positions of the entire package. Alternatively, the positions may be fixed by pressure without using glue.

Figure 11:
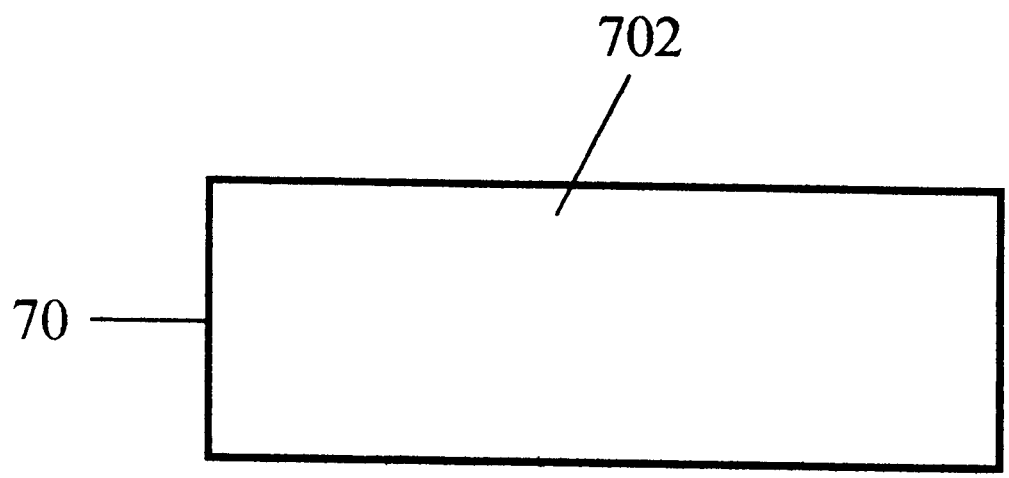
FIG. 11 shows a transparent top lid serving as interconnection.
Figure 11:
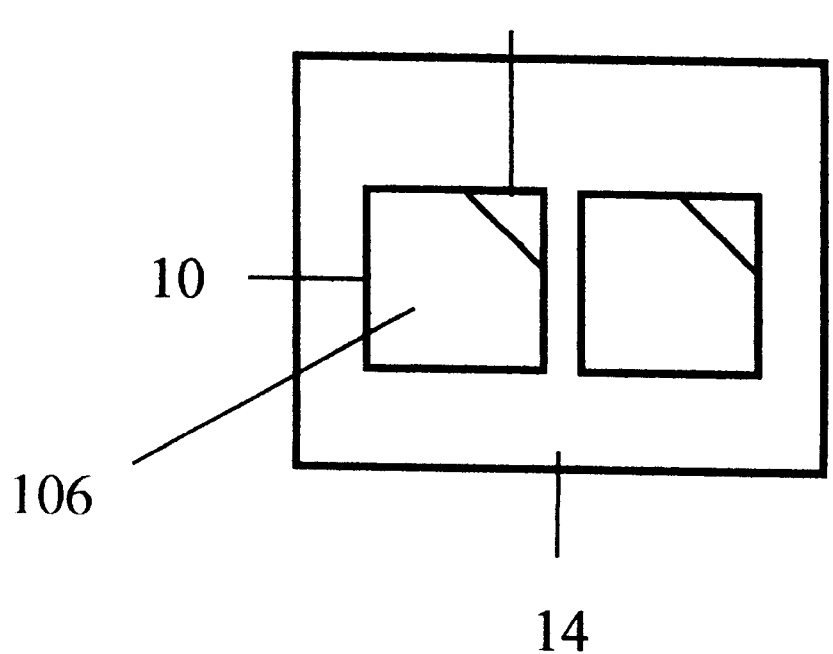

FIGS. 11 and 12 show another embodiment of the present invention. Instead of the flat metal interconnections in FIGS. 2 and 3, a transparent plate 70 is used as the flat interconnection. The transparent plate 70 is covered with transparent or semi-transparent conductive film 702.

The structure can be used as an array of light emitting diodes or be sawed into individual units.

While particular embodiments of the invention has been described as applied to LED packaging, the technique is also applicable to other types of semiconductor device packaging such as LED, image sensor chip, photo diode, etc. It will be apparent to those skilled in the art that various modifications may be made in the embodiments without departing from the spirit of the present invention. Such modifications are all within the scope of this invention.

What is claimed is:

1. A semiconductor device package comprising:
   at least one semiconductor device, having at least one electrode at the top surface of said semiconductor device;
   at least a flat conductive stripe contacting said electrode for interconnecting said semiconductor device, and parallel to the surface of said semiconductor device, wherein said electrode at the top surface is located at one corner of said top surface.

2. A semiconductor device package comprising:
   at least one semiconductor device, having at least one electrode at the top surface of said semiconductor device;
   at least a flat conductive stripe contacting said electrode for interconnecting said semiconductor device, and parallel to the surface of said semiconductor device,
   wherein said semiconductor device is selected from the group consisting of laser diode, LED, image sensor chip and photo diode, and
   wherein the light emitting area is at the center of said top surface not covered by said flat metal strip.

3. A semiconductor device package as described in claim 2, wherein said flat conductive strip is a transparent plate covering the entire top surface of said semiconductor device.

4. A semiconductor device package, comprising:
   at least one semiconductor device, having at least one electrode at the top surface of said semiconductor device;
   at least a flat conductive stripe contacting said electrode for interconnecting said semiconductor device, and parallel to the surface of said semiconductor device; wherein there are two electrodes at the top surface of said semiconductor device, each connected by an individual said flat conductive strip.

5. A semiconductor device package as described in claim 4, wherein a first electrode of said two electrodes and a second electrode of said two electrodes are placed at opposite corners of the top surface of said semiconductor device, and said first electrode of a first said semiconductor device is connected to said second electrode of a second said semiconductor device such that the first semiconductor device is connected in series with the second semiconductor device through said conductive flat strip.

6. A semiconductor device package comprising:
   at least one semiconductor device, having at least one electrode at the top surface of said semiconductor device;
   at least a flat conductive stripe contacting said electrode for interconnecting said semiconductor device, and parallel to the surface of said semiconductor device,
   wherein said semiconductor device has one electrode at the top surface of said semiconductor device and a second electrode at the bottom surface of said semiconductor device, and said flat conductive strip connecting the top electrode of one said semiconductor device to the bottom electrode of a second semiconductor device.

* * * * *